(12) United States Patent
Shibata

(10) Patent No.: US 10,867,826 B2
(45) Date of Patent: Dec. 15, 2020

(54) SUBSTRATE CONVEYANCE ROBOT AND SUBSTRATE CONVEYANCE APPARATUS

(71) Applicant: KAWASAKI JUKOGYO KABUSHIKI KAISHA, Kobe (JP)

(72) Inventor: Takeshi Shibata, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 87 days.

(21) Appl. No.: 16/079,603

(22) PCT Filed: Feb. 27, 2017

(86) PCT No.: PCT/JP2017/007362
§ 371 (c)(1),
(2) Date: Aug. 24, 2018

(87) PCT Pub. No.: WO2017/146252
PCT Pub. Date: Aug. 31, 2017

(65) Prior Publication Data
US 2019/0054613 A1 Feb. 21, 2019

(30) Foreign Application Priority Data
Feb. 26, 2016 (JP) .................................. 2016-036421

(51) Int. Cl.
*H01L 21/677* (2006.01)
*B25J 11/00* (2006.01)
(Continued)

(52) U.S. Cl.
CPC ........ *H01L 21/67766* (2013.01); *B25J 9/042* (2013.01); *B25J 9/06* (2013.01);
(Continued)

(58) Field of Classification Search
CPC .............................................. H01L 21/67766
See application file for complete search history.

(56) References Cited

U.S. PATENT DOCUMENTS 6,382,039 B1  5/2002  Choi
9,539,727 B2 * 1/2017  Kitahara .................. B25J 9/044
(Continued)

FOREIGN PATENT DOCUMENTS

JP  S63-141341 A  6/1988
JP  2000-117667 A  4/2000
(Continued)

OTHER PUBLICATIONS

Oct. 3, 2019 Office Action issued in Japanese Patent Application No. 2016-036421.

*Primary Examiner* — Thomas Randazzo
(74) *Attorney, Agent, or Firm* — Oliff PLC

(57) ABSTRACT

A robot including an elevating/lowering drive mechanism for elevating/lowering a robot arm having an end effector holding a substrate, and a cover unit for covering the elevating/lowering drive mechanism, wherein the elevating/lowering drive mechanism has a fixed portion having a guide rail extending in a vertical direction and an elevating/lowering portion driven to be elevated/lowered along the guide rail, wherein the robot arm has a base portion link connecting to the elevating/lowering portion and a link member connected to the base portion link, and wherein the cover unit has a fixed-side cover provided to the fixed portion and the elevating/lowering portion moves, and a guide rail cover provided to the elevating/lowering portion for covering an upper portion of the guide rail exposed when the elevating/lowering portion is lowered. A substrate conveyance robot capable of miniaturizing a substrate conveyance apparatus without inconvenience such as decline in rigidity of a robot arm.

7 Claims, 13 Drawing Sheets

(51) Int. Cl.
    *B65G 47/90*     (2006.01)
    *B25J 18/04*     (2006.01)
    *B25J 9/04*     (2006.01)
    *B25J 9/06*     (2006.01)
    *B65G 49/07*     (2006.01)
    *H01L 21/687*     (2006.01)

(52) U.S. Cl.
    CPC ........... *B25J 11/0095* (2013.01); *B25J 18/04* (2013.01); *B65G 47/902* (2013.01); *B65G 49/07* (2013.01); *H01L 21/67742* (2013.01); *H01L 21/67751* (2013.01); *H01L 21/67778* (2013.01); *H01L 21/67748* (2013.01); *H01L 21/68707* (2013.01)

(56) References Cited

U.S. PATENT DOCUMENTS

| | | | | |
|---|---|---|---|---|
| 2002/0053509 | A1* | 5/2002 | Hanson | H01L 21/6723 204/198 |
| 2002/0106269 | A1* | 8/2002 | Nishimura | B25J 18/025 414/222.13 |
| 2007/0020080 | A1* | 1/2007 | Wirth | H01L 21/68707 414/744.5 |
| 2009/0266194 | A1* | 10/2009 | Zhang | B25J 9/042 74/490.01 |
| 2010/0290886 | A1* | 11/2010 | Hashimoto | B25J 15/0014 414/800 |
| 2011/0262251 | A1* | 10/2011 | Otogawa | H01L 21/67766 414/222.02 |
| 2016/0107317 | A1* | 4/2016 | Hashimoto | B25J 15/0014 414/744.2 |
| 2016/0136818 | A1 | 5/2016 | Kitahara et al. | |
| 2016/0167229 | A1* | 6/2016 | Hosek | H01L 21/67742 700/248 |
| 2018/0256259 | A1* | 9/2018 | Crawford | A61B 6/5217 |

FOREIGN PATENT DOCUMENTS

| | | |
|---|---|---|
| JP | 2001-205582 A | 7/2001 |
| JP | 2002-338042 A | 11/2002 |
| JP | 2006-005362 A | 1/2006 |
| JP | 2006-198760 A | 8/2006 |
| JP | 4980127 B2 | 7/2012 |
| JP | 2015-36185 A | 2/2015 |
| WO | 2009/066573 A1 | 5/2009 |

* cited by examiner

Section A-A

Section X-X

SUBSTRATE CONVEYANCE ROBOT AND SUBSTRATE CONVEYANCE APPARATUS

TECHNICAL FIELD

The present invention relates to a substrate conveyance robot for conveying substrates such as wafers for manufacturing semiconductors, and to a substrate conveyance apparatus provided with the robot.

BACKGROUND ART

As an example of an apparatus in which a substrate conveyance robot is used, a representative example of a semiconductor manufacturing apparatus is illustrated in FIG. 1 and FIG. 2. A semiconductor manufacturing apparatus 101 is provided with a wafer processing apparatus 106 for processing a semiconductor wafer W, a FOUP 102 which is a container for string the wafer W, and a wafer conveyance apparatus (substrate conveyance apparatus) for conveying the wafer W between the wafer processing apparatus 106 and the FOUP 102.

The wafer W before or after processing is stored in the FOUP 102, and processing such as such as heat treatment, impurity introduction treatment, thin film formation treatment, lithography treatment, washing treatment and flattening treatment are performed in the wafer processing apparatus 106.

The wafer processing apparatus 106 is provided with a processing space forming portion 112 in which a processing space 111 is formed, a processing apparatus body (not illustrated) disposed inside the processing space 111 to process the wafer W, and a processing space adjustment apparatus (not illustrated) for adjusting the atmosphere gas filled in the processing space 111.

A wafer conveyance apparatus 107 is provided with a preparation space forming portion 117 in which a preparation space 116 is formed, a substrate conveyance robot 31 disposed in the preparation space 116, an aligner 119 disposed in the preparation space 116 to adjust the orientation of the wafer W, and a preparation space adjustment apparatus (not illustrated) for adjusting the atmosphere gas filled in the preparation space 116.

The preparation space forming portion 117 is formed into a rectangular parallelepiped box shape, and the substrate conveyance robot 31 is disposed almost in the center of the preparation space 116 in the longitudinal direction.

The substrate conveyance robot 31 takes the wafer W out from an inside-FOUP space 105 and puts the wafer W into the inside-FOUP space 105 again. Additionally, the substrate conveyance robot 31 takes the wafer W out from the processing space 111 and puts the wafer W into the processing space 111 again.

Further, the substrate conveyance robot 31, when conveying the wafer W to the wafer processing apparatus 106 from the FOUP 102, temporarily conveys the wafer W taken out from the FOUP 102 to the aligner 119 and makes the orientation of each wafer W the same, then inserts it to the wafer processing apparatus 106.

The substrate conveyance robot 31 is a scalar shaped horizontal articulated robot, provided with a robot arm 62, a base 63 to which the base end portion of the robot arm 62 is connected, and a robot hand (end effector) 64 to which the distal end portion of the robot arm 62 is connected and grips the wafer W. The robot arm 62 has first and second links 65, 66.

Additionally, for the vertical movement for taking the wafers W stored above and below in a plurality of stages in the FOUP 102 and inserting them to the wafer processing apparatus 106, the base 63 has a fixed portion 46 fixed to an installation surface 45, and a elevating/lowering portion 47 provided so as to be displaceable in the vertical direction with respect to the fixed portion 46 (refer to FIG. 2). The base end portion of the robot arm 62 is provided to the elevating/lowering portion 47 so as to rotate. The elevating/lowering portion 47 is formed in a cylindrical shape and provided such that its axis extends in the vertical direction. The upper portion of the elevating/lowering portion 47 is to be the upper portion of the base 63. The elevating/lowering portion 47 driven to be elevated/lowered allows the position of the robot hand 64 provided to the distal end portion of the robot arm 62 to be vertically changed.

The substrate conveyance robot 31 including the base 63 is arranged in the preparation space 116 as a clean environment. Therefore, the fixed portion 46 and the elevating/lowering portion 47 are stored in a casing 67 for preventing contamination in the elevating/lowering portion preparation space 116 due to dust occurring upon elevation/lowering of the elevating/lowering portion 47, and the robot arm 62 is provided to the extended portion of the elevating/lowering portion 47 penetrating the ceiling portion of the casing 67.

In the above-stated wafer conveyance apparatus 107, it is desirable that the size of the preparation space, namely the volume of the preparation space forming portion 117 is as small as possible for facilitating maintenance of the clean environment.

For example, in Patent Document 1, the substrate conveyance robot 31 is arranged close to one side in the depth direction of the preparation space so that the length to the distal end of the arm when the robot arm is contracted is shortened in order to reduce the dimension of the depth direction (direction orthogonal to the arrangement direction of FOUP) of the preparation space.

However, even in this case, the dimension of the depth direction of the preparation space cannot be a dimension smaller than the length of each link configuring the robot arm.

As above, the substrate conveyance robot 31 used in the wafer conveyance apparatus 107 is required to meet conflicting demands of maintaining the maximum reach distance in the horizontal surface to a predetermined size, while making the length to the distal end of the arm when contracting the robot arm as short as possible.

For such demands, it is conceivable to solve them by increasing the number of links constituting the robot arm and also shortening the length of each link, since it is not preferable to arrange a traveling axis (axis which causes the robot to travel in the direction of arrangement of FOUP) which may cause generation of a new contamination source.

However, although it is necessary to sufficiently secure the rigidity of each link constituting the robot arm for preventing vibration during operation of the substrate conveyance robot, if the number of links is increased while maintaining the vertical height (thickness) of each link for securing sufficient rigidity, the vertical height (thickness) of the entire robot arm increases according to the increase in the number of links, and the minimum height of the hand gripping the wafer becomes higher than before. As a result, there is a problem that the hand cannot access to the wafer stored in the lowest position in the FOUP.

CITATION LIST

Patent Document

[Patent Document 1] Japanese Patent No. 4980127

SUMMARY OF INVENTION

Objects to be Achieved by the Invention

The present invention is made considering the above-mentioned problems of the conventional technology, and its object is to provide a substrate conveyance robot capable of miniaturizing a substrate conveyance apparatus and a substrate conveyance apparatus comprising the robot without inconvenience such as decline in rigidity of a robot arm.

Means for Achieving the Objects

In order to achieve the above-mentioned objects, a substrate conveyance robot according to a first aspect of the present invention comprises: a robot arm whose distal end portion has an end effector for holding a substrate; an elevating/lowering drive mechanism for elevating/lowering the robot arm; and a cover unit for covering the elevating/lowering drive mechanism, wherein the elevating/lowering drive mechanism has a fixed portion to which a guide rail extending in a vertical direction is provided, and an elevating/lowering portion which is driven to be elevated/lowered along the guide rail, wherein the robot arm has a base portion link which is connected to the elevating/lowering portion to be turned, and a link member which is connected to the base portion link to be turned and including the distal end portion, and wherein the cover unit has a fixed-side cover which is provided to the fixed portion and in which the elevating/lowering portion moves, and a guide rail cover which is provided to the elevating/lowering portion for covering an upper portion of the guide rail exposed when the elevating/lowering portion is lowered.

A second aspect of the present invention is that, in the first aspect, a height of an upper surface of the base portion link is substantially the same as or below a height of an upper surface of the fixed portion when the elevating/lowering portion is lowered to the lowest point.

A third aspect of the present invention is that, in the first or second aspect, an upper end the guide rail cover is substantially the same as the height of the upper surface of the fixed portion when the elevating/lowering portion is lowered to the lowest point.

A fourth aspect of the present invention is that, in any one of the first to third aspects, the link member has two or more links which are connected to each other to be turned.

In order to achieve the above-mentioned objects, a substrate conveyance apparatus according to a fifth aspect of the present invention comprises: the substrate conveyance robot according to any one of the first to fourth aspects; and a preparation space forming portion in which the substrate conveyance robot is located.

A sixth aspect of the present invention is that, in the fifth aspect, the substrate conveyance robot has a base including the elevating/lowering drive mechanism, and wherein the base is arranged close to one side in a depth direction of the inside of the preparation space forming portion.

Effect of the Invention

According to the present invention, a substrate conveyance robot capable of miniaturizing a substrate conveyance apparatus without inconvenience such as decline in rigidity of a robot arm can be provided.

EMBODIMENT OF THE INVENTION

Figure 1:
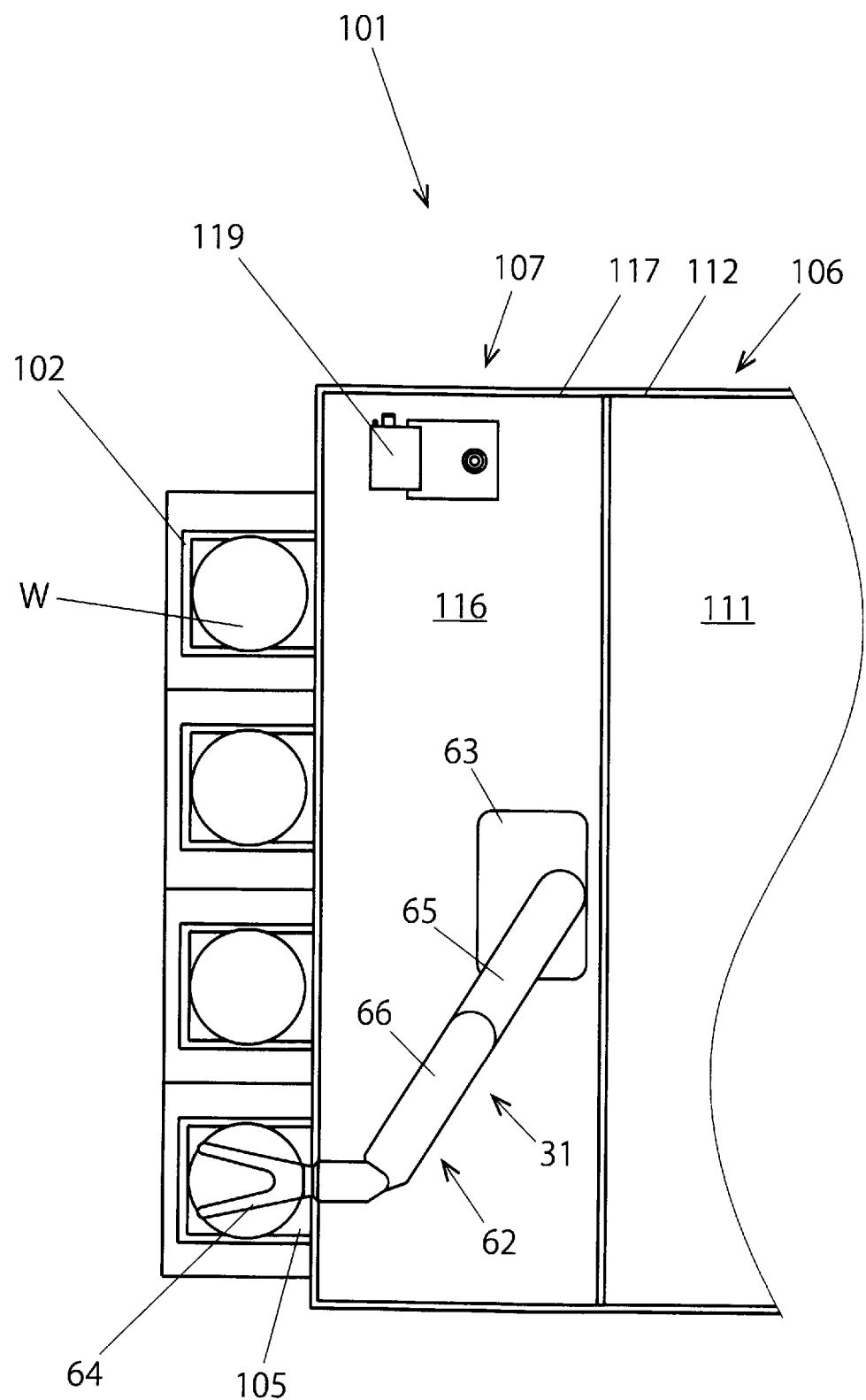
FIG. 1 is a plan view illustrating an example of a substrate manufacturing apparatus.
Figure 2:
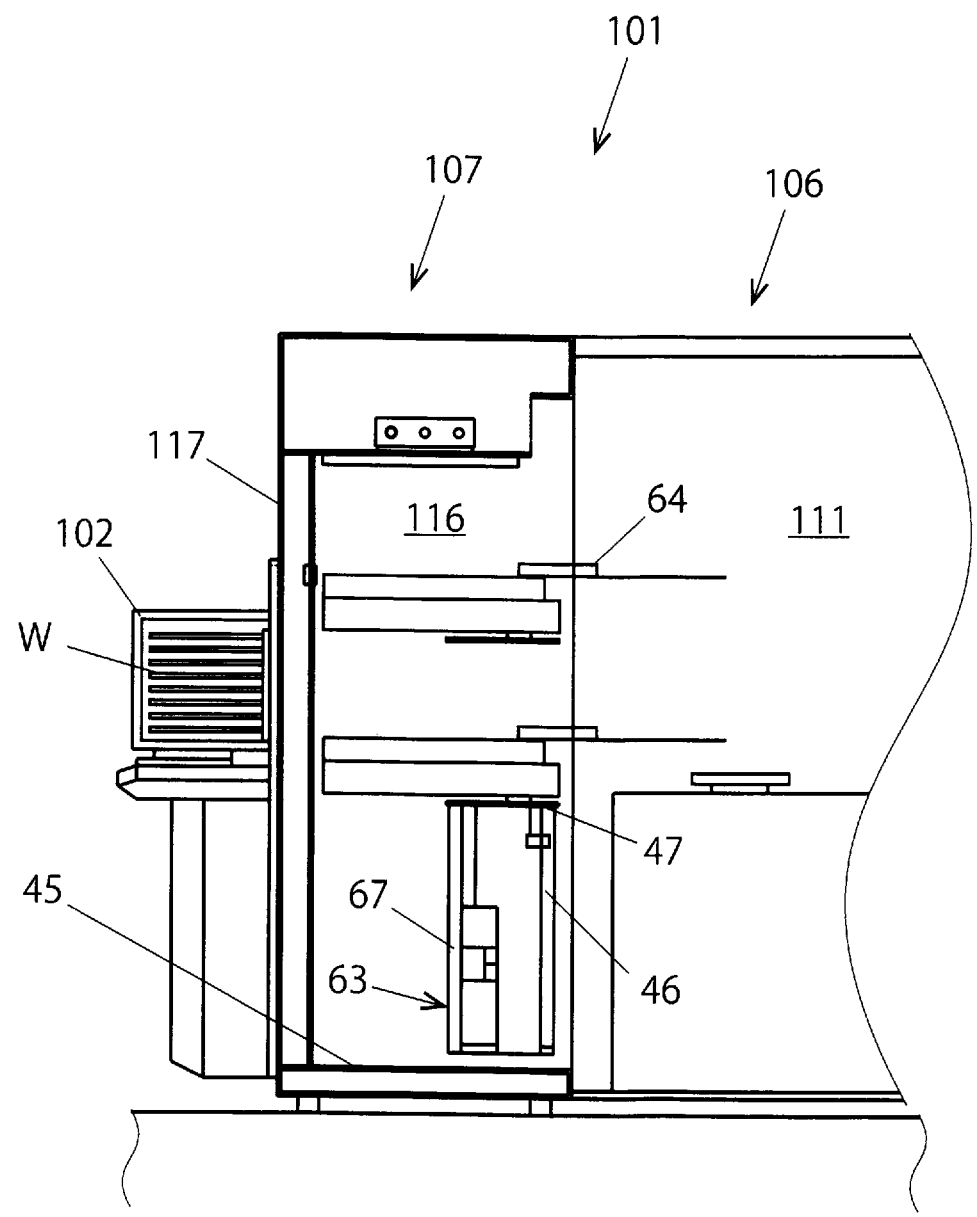
FIG. 2 is a longitudinal section view of the substrate manufacturing apparatus in FIG. 1.

Hereunder, a substrate conveyance robot according to an embodiment of the present invention will be described referring to the drawings.

Figure 3:
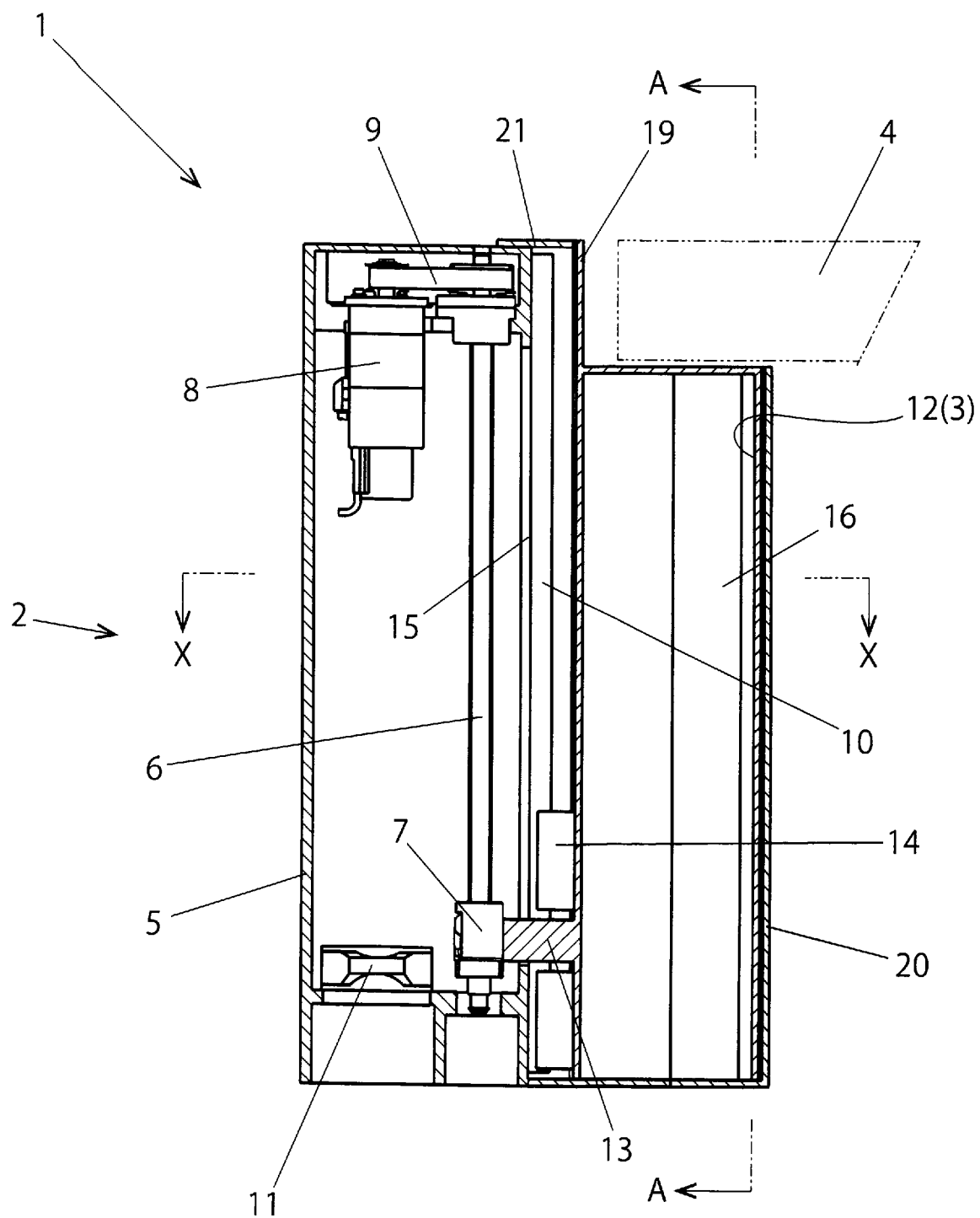
FIG. 3 is a section view illustrating a structure of a fixed portion and an elevating/lowering portion when the elevating/lowering portion is lowered to the lowest point in a substrate conveyance robot according to an embodiment of the present invention.
Figure 4:
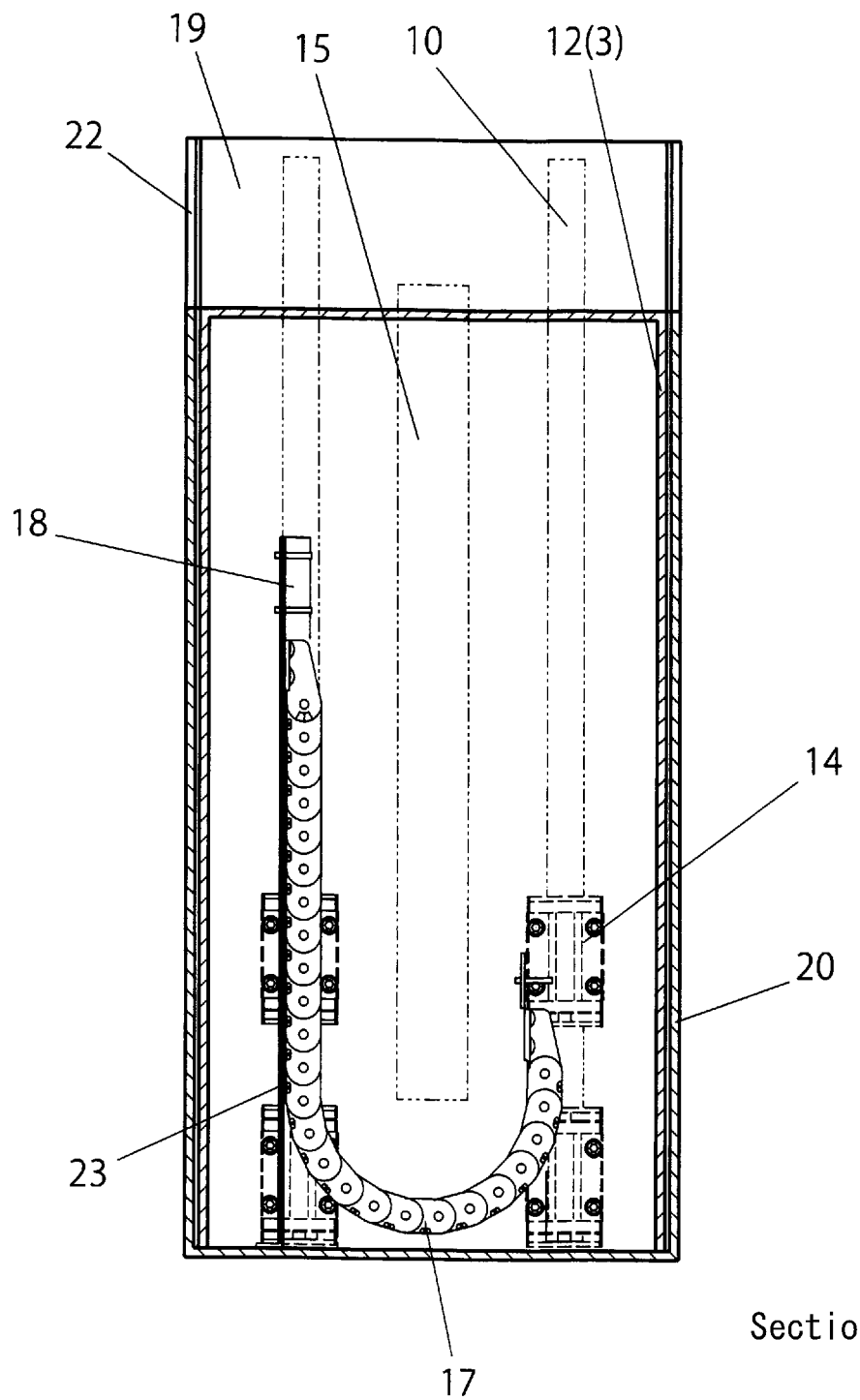
FIG. 4 is a section view taken along A-A in FIG. 3.
Figure 5:
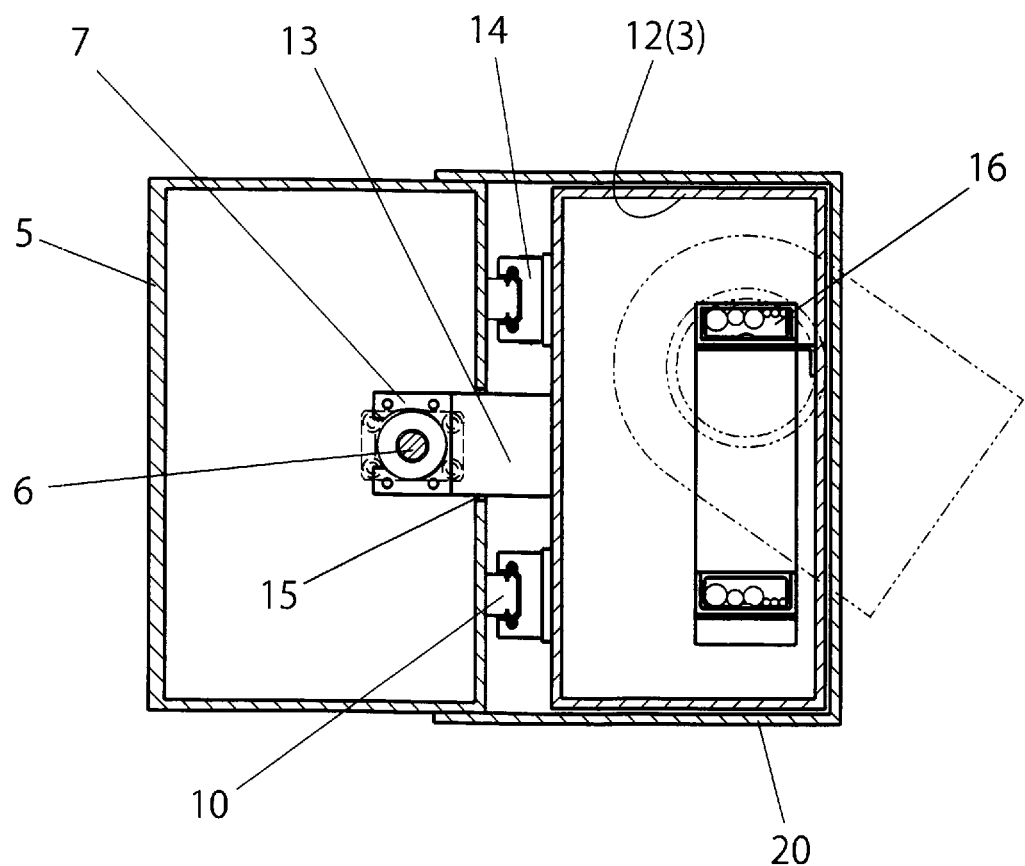
FIG. 5 is a section view taken along X-X in FIG. 3.

As illustrated in FIG. 3 to FIG. 5, a substrate conveyance robot 1 according to this embodiment comprises an elevating/lowering drive mechanism 1 for elevating/lowering an robot arm. The elevating/lowering drive mechanism 1 has a fixed portion fixed to an installation surface and an elevating/lowering portion 3 provided to the side portion of the fixed portion 2 so as to be elevated/lowered. A base portion link 4 of the robot arm is provided above the elevating/lowering portion 3 so as to be horizontally turned. A hand (end effector) (not illustrated) for holding a substrate is provided to the distal end portion of the robot arm.

The fixed portion 2 of the elevating/lowering drive mechanism 1 comprises a fixed side casing 5 having a substantially rectangular parallelepiped shape whose outer shape is longitudinally long (refer to FIG. 3, FIG. 4, FIG. 8 to FIG. 10). Inside the fixed side casing 5, there are provided a ball screw 6 for elevating/lowering the elevating/lowering portion 3, a nut member 7 engaged with the ball screw 6 and elevating/lowering by the rotation of the ball screw 6, a motor 8 for rotationally driving the ball screw 6, and a pulley mechanism 9 which is a power transmission mechanism for transmitting drive force of the motor 8 to the ball screw 6.

Additionally, on an outer surface of the side surface connecting the elevating/lowering portion 3 of the fixed portion 2, two guide rails 10 extending in the vertical direction are arranged parallel to each other with a predetermined interval. Further, at the lower portion inside the fixed side casing 5, there is provided a fan 11 for ejecting internal air from the lower portion to the outside to generate downward air flow inside.

The elevating/lowering portion 3 comprises a movable side casing 12 having a substantially rectangular parallelepiped shape whose outer shape is longitudinally long, whose bottom portion is opened, and whose ceiling surface and four side surfaces are connected by a plate member (refer to FIG. 3 and FIG. 4). On the surface on the connection side with the fixed portion 2 of the movable side casing 12, there are provided a support member 13 connected to the nut member 7 in the fixed side casing 5 of the fixed portion 2, and a block-shaped moving body 14 engaged with the guide rail 10 and vertically elevating/lowering. Note that, two moving bodies 14 are provided to each of the guide rails 10 in series for safety and reliability of travelling.

Since the support member 13 penetrates the side wall of the fixed side casing 5 on the side connected with the elevating/lowering portion 3, on the side wall of the fixed side casing 5, there is provided a longitudinally elongated opening 15 having a length corresponding to the elevating/lowering stroke of the elevating/lowering portion 3 so that the support member 13 can be elevated/lowered (refer to FIG. 3 and FIG. 4).

The base portion link 4 of the robot arm is turnably provided to the upper surface of the movable side casing 12 of the elevating/lowering portion 3. A cable arrangement area 16 is provided inside the movable side casing 12, in which power supply cables and signal cables to a servo motor etc. provided inside the base portion link 4 and a link member beyond the same (composed of one or two or more links) are routed. Additionally, a cable bear (registered trademark) 17 is provided in the movable side casing 12 for processing these cables upon elevation/lowering of the elevating/lowering portion 3.

In this embodiment, the height of the upper surface of the movable side casing 12 is set such that the upper surface of the base portion link 4 has the almost same height as the upper surface of the fixed side casing 5 as illustrated in FIG. 3 when the robot arm is at the lowest position.

Figure 13:
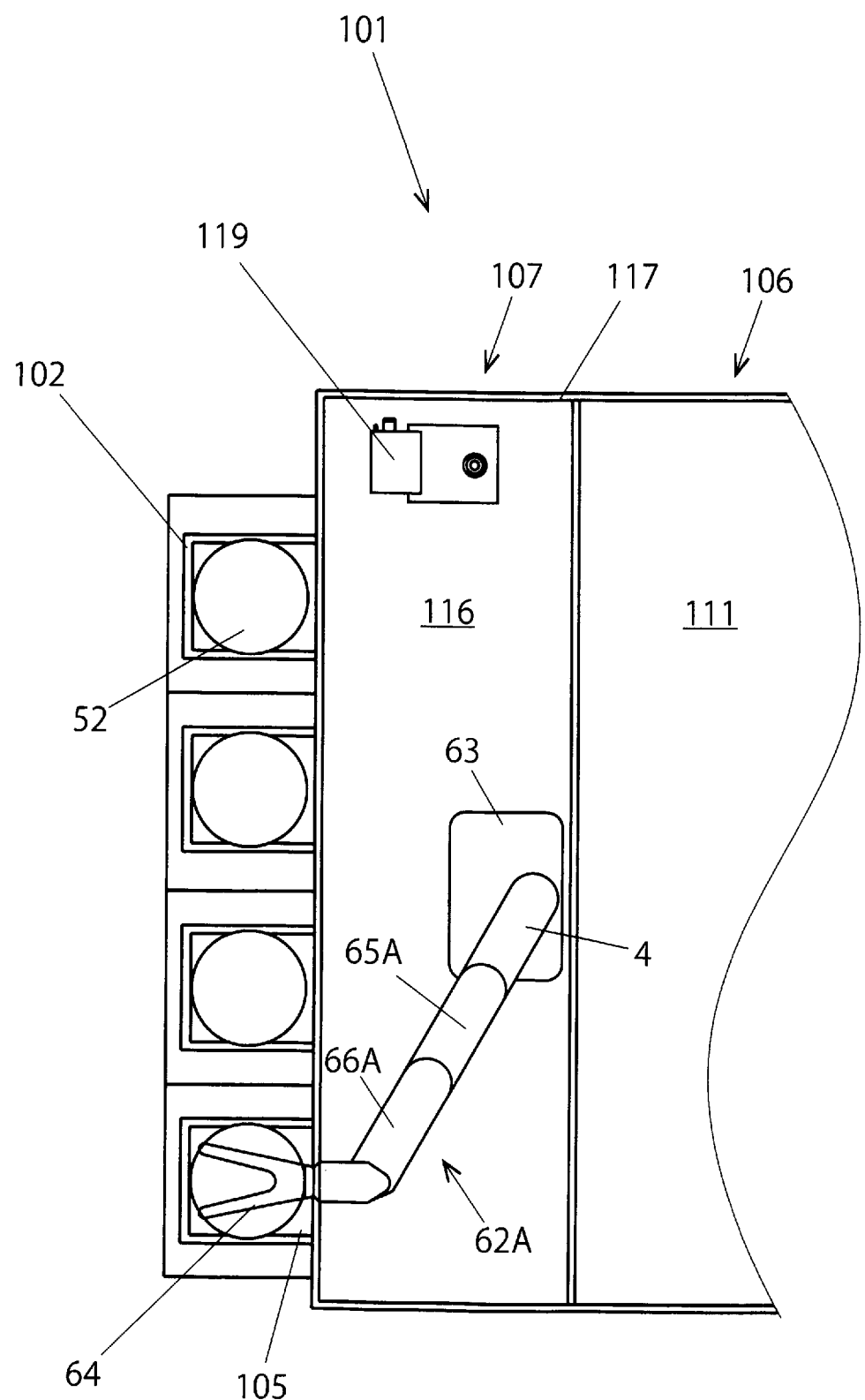
FIG. 13 is a plan view illustrating a substrate conveyance apparatus comprising the substrate conveyance robot in FIG. 3.

Accordingly, as illustrated in FIG. 13, by configuring a robot arm 62A using a horizontal turning arm mechanism having a first link 65A and a second link 66A which are formed by shortening the two links used in a conventional substrate conveyance apparatus, the height position of the hand at the distal end portion of the arm can be maintained the same as in the conventional apparatus without declining rigidity of each link.

As a result, in the substrate conveyance robot according to this embodiment, it is possible to make the number of inks three including the base portion link 4 without declining rigidity of each link, and the length of each link can be shortened for realizing the same hand maximum reach distance as the conventional substrate conveyance robot having two links.

Additionally, by arranging the base 63 of the substrate conveyance robot close to one side in the depth direction inside the preparation space forming portion 116 as illustrated in FIG. 13, the width of the preparation space can be smaller as the length of each link becomes shorter, since the dimension in the depth direction of the preparation space 116 of the wafer conveyance apparatus is set depending on the length of each link of the substrate conveyance robot. That is, according to the substrate conveyance robot of this embodiment, the width of the preparation space can be reduced while maintaining a predetermined hand maximum reach distance by the length of each link becoming shorter than in the conventional robot Additionally, as stated above, in this embodiment, the height of the upper surface of the movable side casing 12 is set such that the upper surface of the base portion link 4 has the almost same height as the upper surface of the fixed side casing 5 when the robot arm is at the lowest position.

Therefore, the upper surface of the movable side casing is at the position lower than the upper surface of the fixed side casing 5 by almost the height (thickness) of the base portion link 4. As a result, the upper portion of the guide rail 10 is exposed when the elevating/lowering portion 3 is lowered to the lowest point. When the upper portion of the guide rail 10 is exposed, the preparation space may be contaminated by dust, etc. therefrom, and therefore some measures are required.

Then, in this embodiment, contamination by the guide rail 10 as a contamination source is prevented by adopting the following configuration.

Thus, a guide rail cover 19 for covering the upper portion of the guide rail 10 exposed when the elevating/lowering portion 3 is lowered is provided to the upper portion of the elevating/lowering portion 3. Specifically, the guide rail cover 19 is formed as an upward extending portion of the connecting surface with the fixed portion 2 of the movable side casing 12. The movable side casing 12 and the guide rail cover 19 configure a part of a cover unit for covering the elevating/lowering drive mechanism 1.

The width of the guide rail cover 19 is substantially the same as that of the connecting surface with the fixed portion 2 of the movable side casing 12, and the height is set such that it covers the upper surface of the guide rail 10 exposed at the position where the elevating/lowering portion 3 is lowered to the lowest point.

Note that, for preventing dust, etc. from flowing into the preparation space from the guide rail 10, it is preferable that the guide rail cover 19 has substantially the same height as the height of the upper surface of the fixed side casing 5 in order to minimize the gap between the guide rail 10 and a ceiling portion cover 21 to be described later.

Additionally, a fixed-side cover 20 whose upper portion is opened is provided to the fixed side casing 5, the fixed-side cover 20 having a side surface in the movable side casing 12 proximate to an outer surface of a side portion other than the side portion connected to the fixed side casing 5, and a bottom surface. The fixed side casing 5 and the fixed-side cover 20 configure a cover unit for covering the elevating/lowering drive mechanism 1.

The movable side casing 12 configuring the elevating/lowering portion 3 can enter and leave the inside of the fixed-side cover 20 by elevating/lowering via the opened upper portion of the fixed-side cover 20, and when the movable side casing 12 is lowered and positioned at the lowest point, the entirety or a part of the portion below the height of the substantially upper end portion of the movable side casing 12 can be accommodated inside the fixed-side cover 20.

Since the side inner surface of the fixed-side cover 20 is configured to be proximate to the side outer surface of the movable side casing 12, it is possible to suppress the discharge of dust, etc. inside the fixed-side cover 20 to the outside through the side inner surface of the fixed-side cover 20 and the side outer surface of the movable side casing 12.

Figure 6:
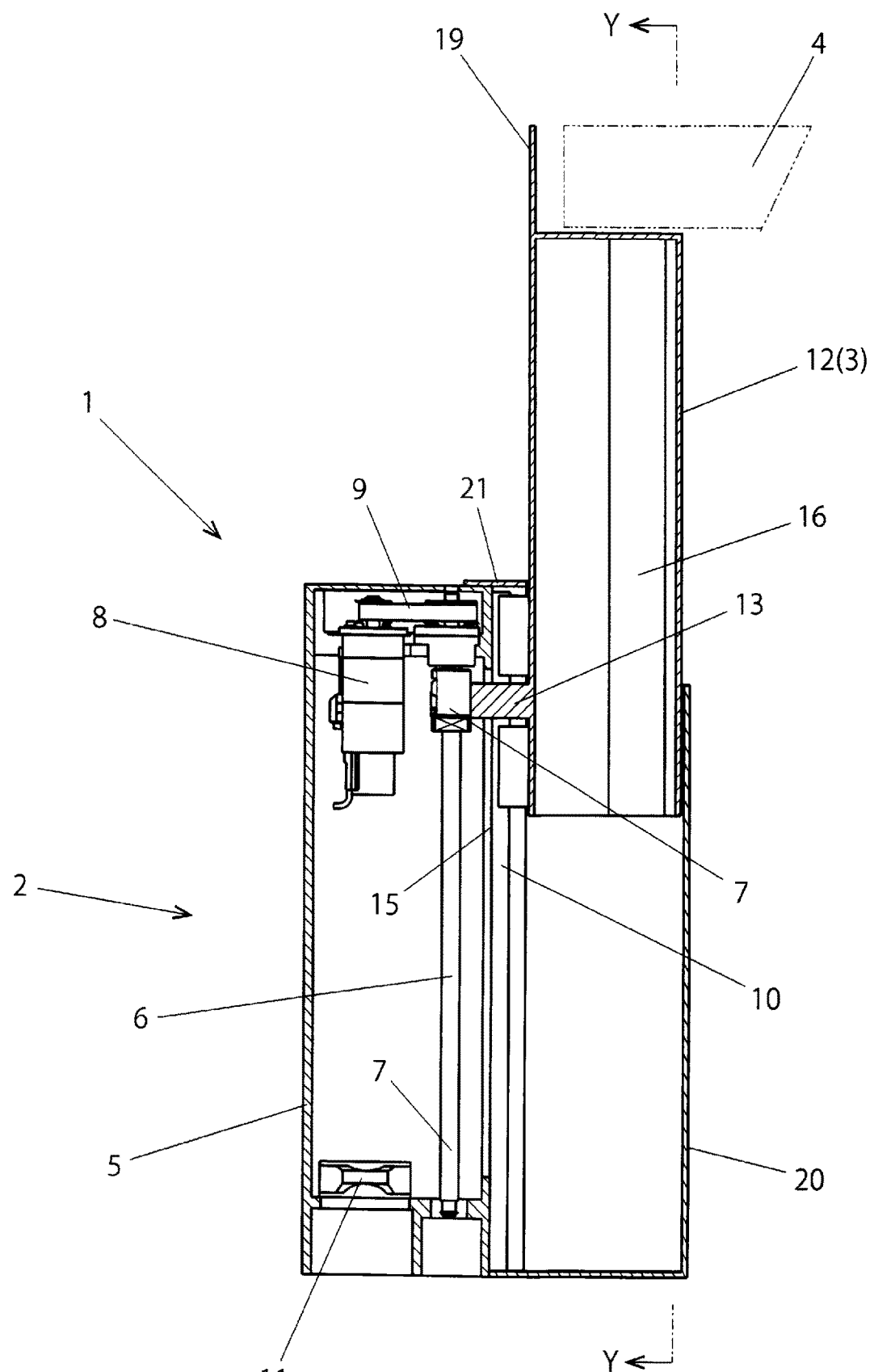
FIG. 6 is a section view illustrating a structure of the fixed portion and the elevating/lowering portion when the elevating/lowering portion is elevated to the highest point in the substrate conveyance robot in FIG. 3.

Note that, the bottom surface is provided to the fixed-side cover 20 in order to prevent the dust, etc. from discharging to the outside by forming the inside of the fixed-side cover 20 with the closed space, since the inside of the fixed-side cover 20 communicates with the space where the guide rail 10 exists when the movable side casing 12 is elevated (refer to FIG. 6, for example).

Additionally, the upper end of the fixed-side cover 20 is configured to be higher than the height of the lower end of the movable side casing 12 when the movable side casing 12 is elevated and positioned at the highest point. Thereby, even when the movable casing 12 is elevated and positioned at the highest point, it is possible to suppress the discharge of dust, etc. inside the fixed-side cover 20 to the outside through the side inner surface of the fixed-side cover 20 and the side outer surface of the movable side casing 12 since the lower portion of the side of the movable side casing 12 is accommodated inside the fixed-side cover 20.

A flange-shaped ceiling portion cover 21 whose distal end portion is protruding to a position proximate to the guide rail cover 19 above the guide rail 10 is connected to the upper surface of the fixed side casing 5. Further, a flanged-shaped side portion cover 22 whose distal end portion is protruding to the position of the guide rail cover 19 or to the position beyond the guide rail cover 19 is connected to the side of the guide rail 10 (FIG. 4).

Figure 7:
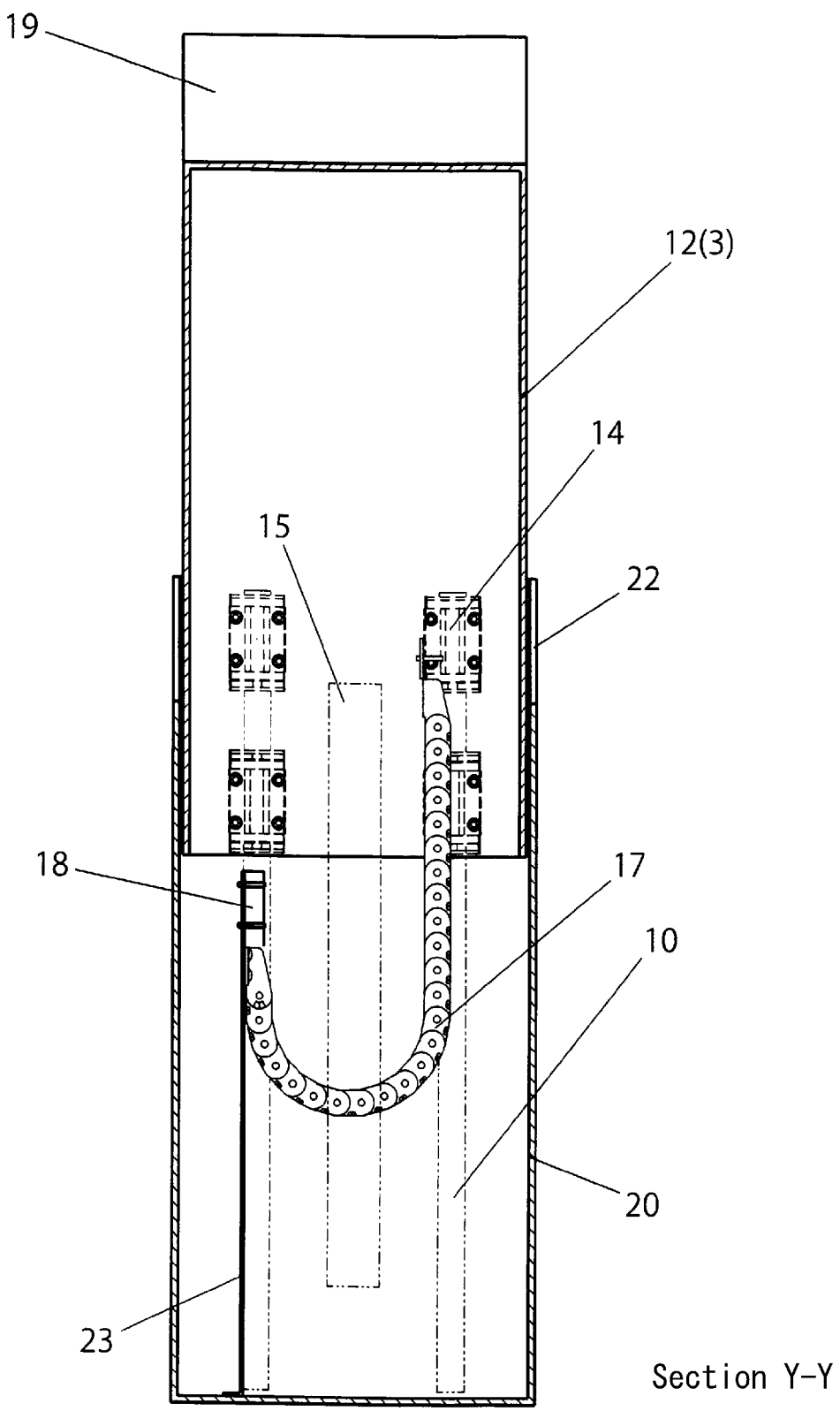
FIG. 7 is a section view taken along Y-Y in FIG. 6.
Figure 8:
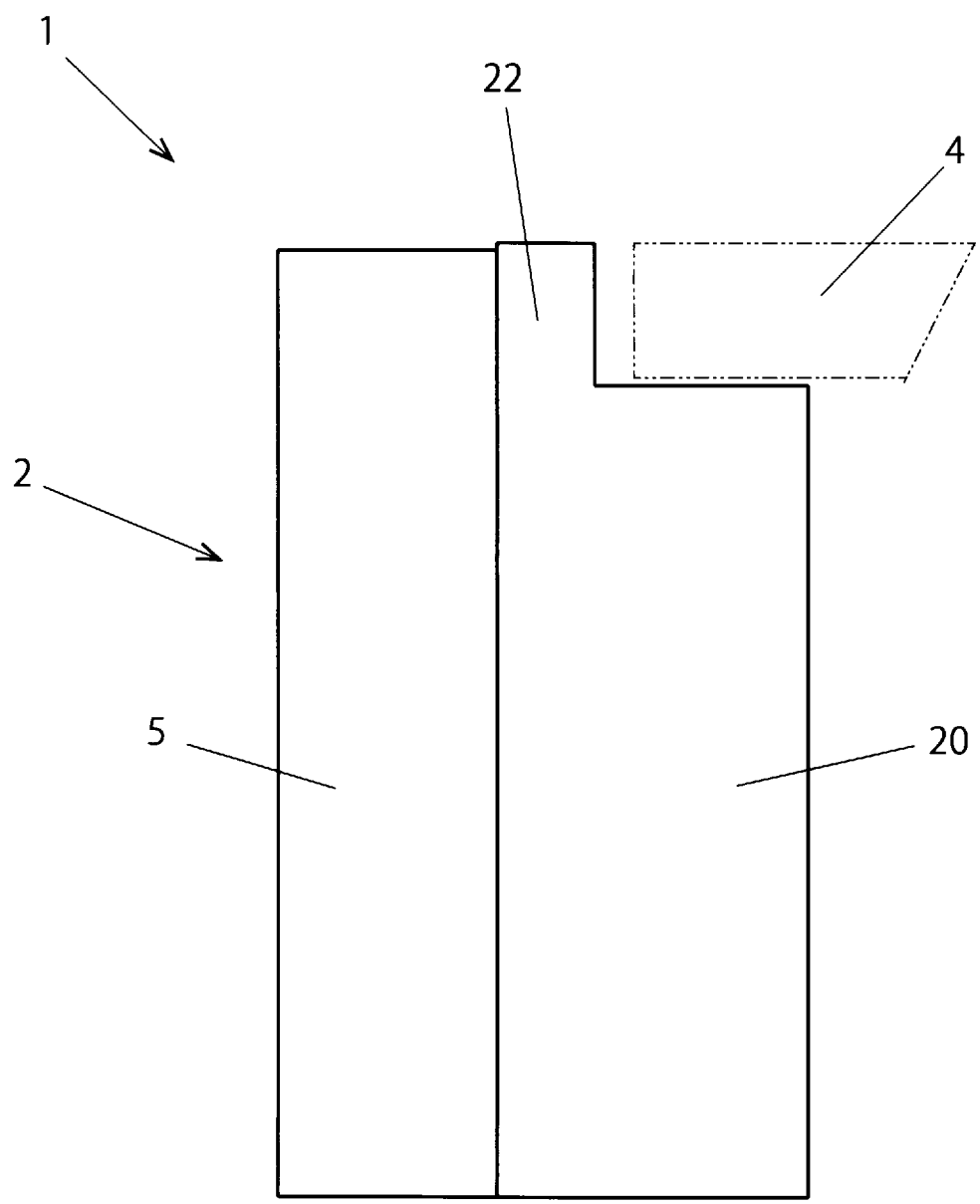
FIG. 8 is an outline view illustrating the fixed portion and the elevating/lowering portion when the elevating/lowering portion is lowered to the lowest point in the substrate conveyance robot in FIG. 3.
Figure 9:
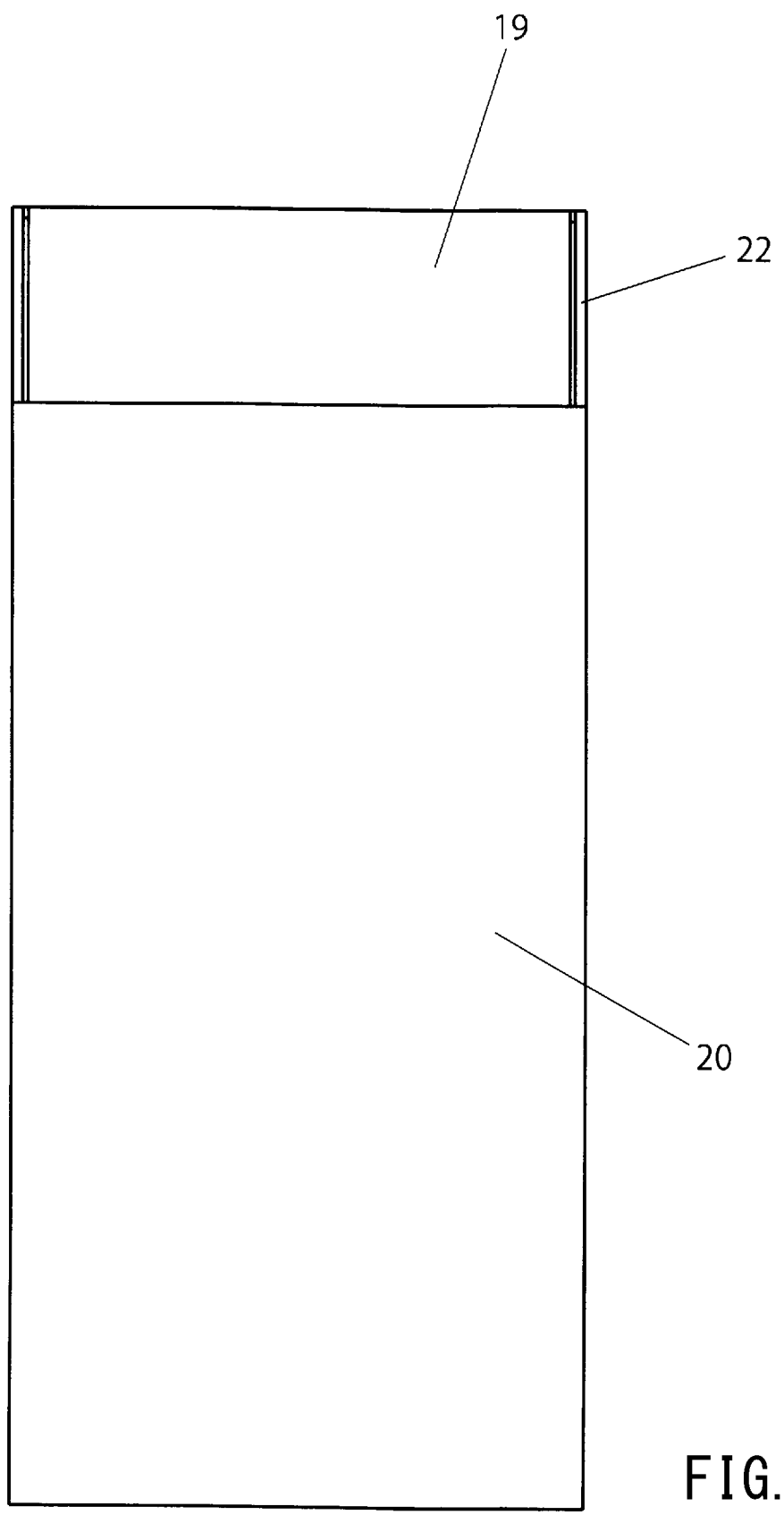
FIG. 9 is a right side view of FIG. 8.
Figure 10:
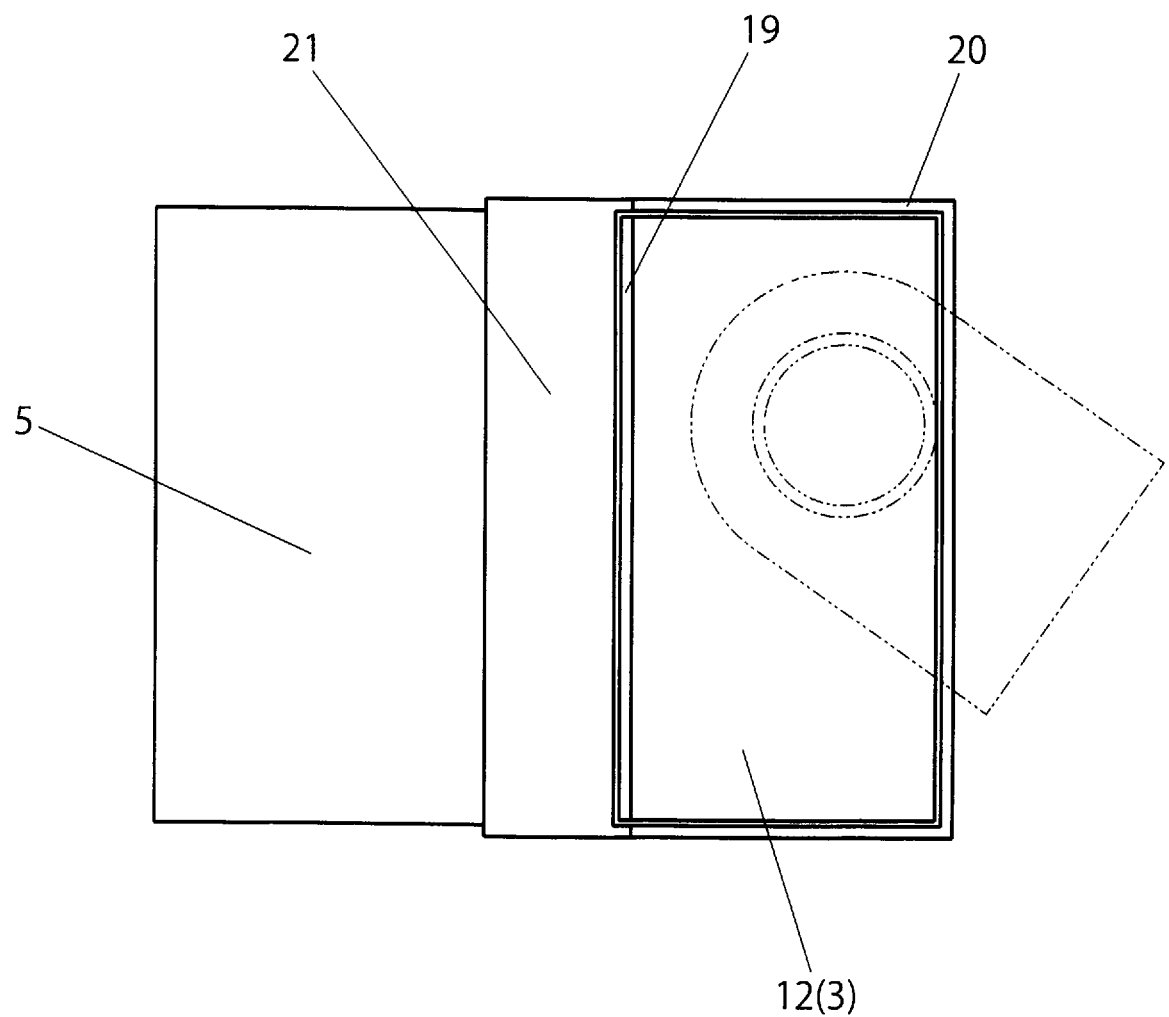
FIG. 10 is a plan view of FIG. 8.
Figure 11:
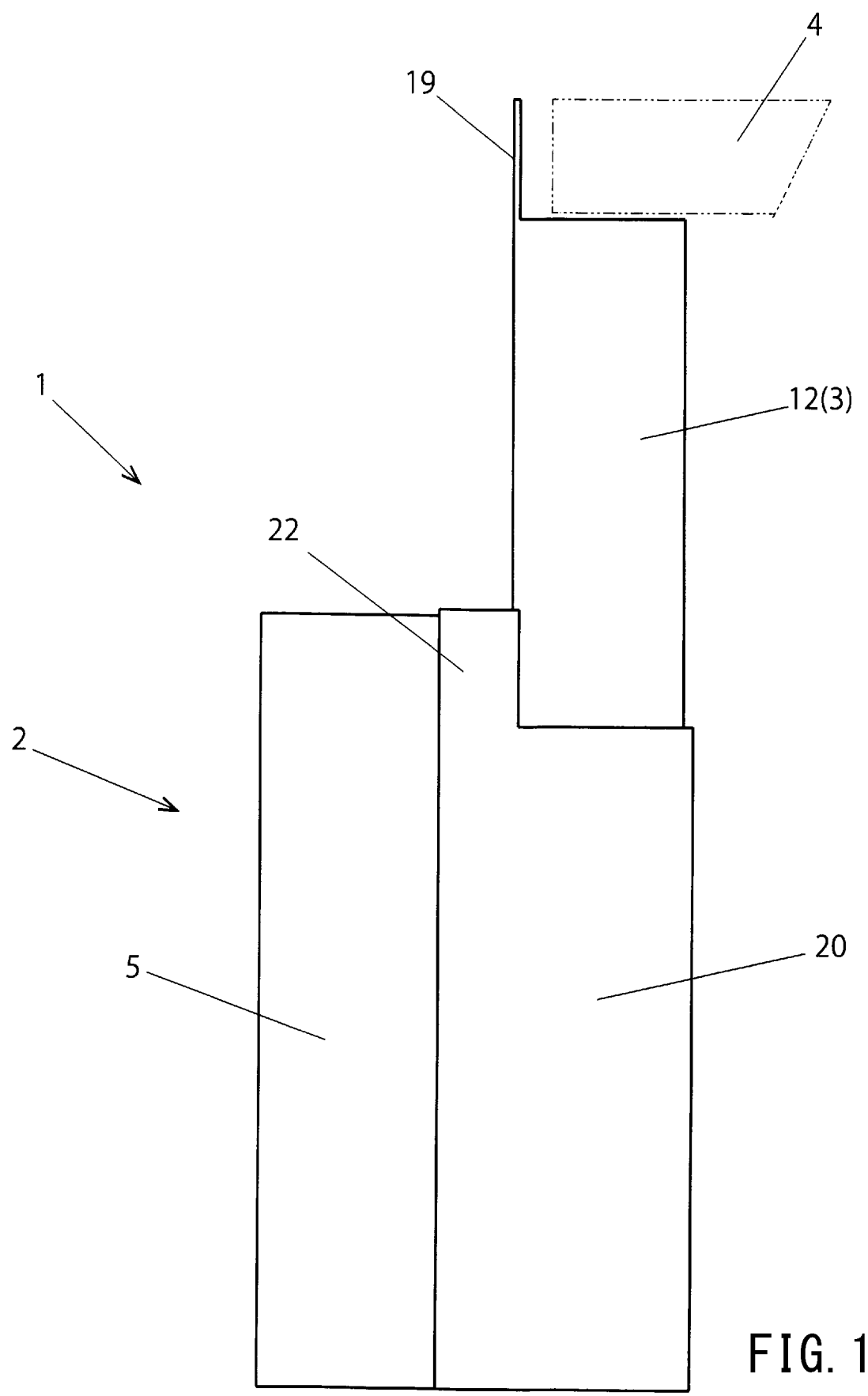
FIG. 11 is an outline view illustrating the fixed portion and the elevating/lowering portion when the elevating/lowering portion is elevated to the highest point in the substrate conveyance robot in FIG. 3.
Figure 12:
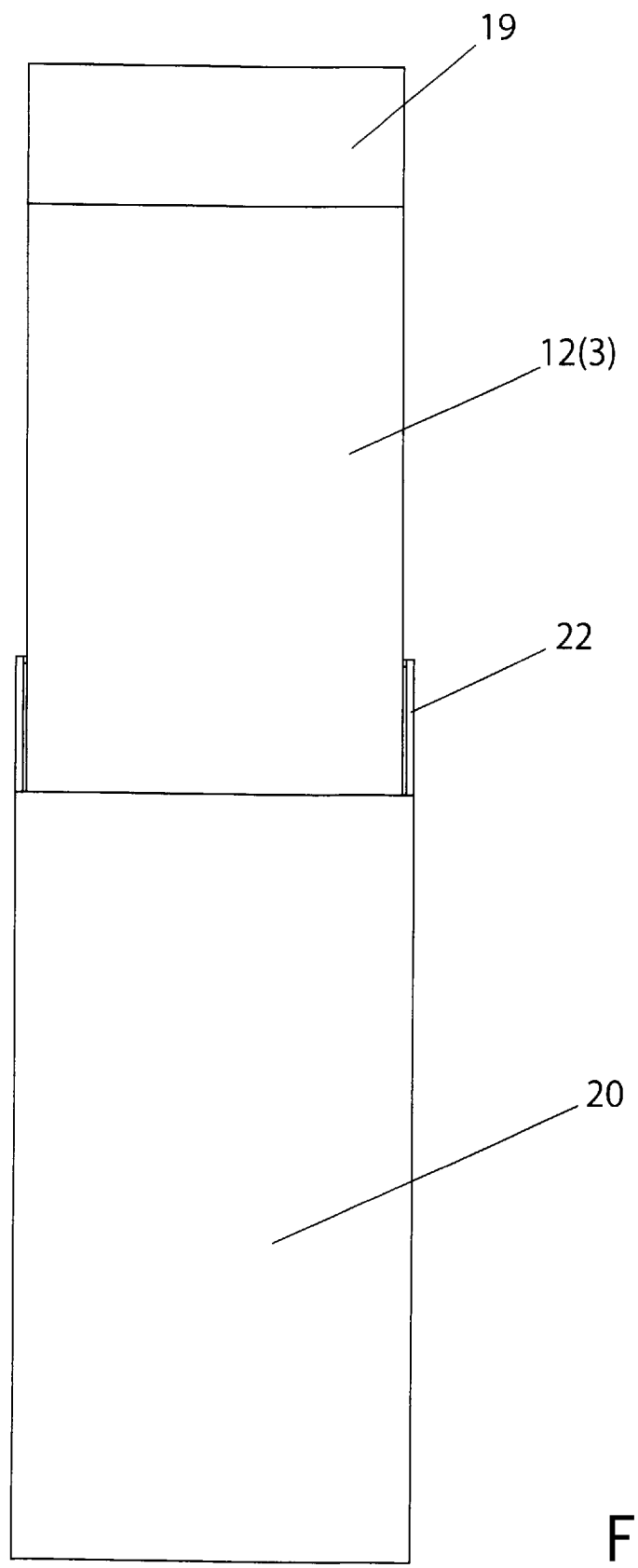
FIG. 12 is a right side view of FIG. 11.

Drawings corresponding to FIG. 3 and FIG. 4 in which the elevating/lowering portion 3 is elevated to and positioned at the highest point are illustrated in FIG. 6 and FIG. 7 respectively. Further, outline drawings corresponding to FIG. 3 to FIG. 7 are illustrated in FIG. 8 to FIG. 12 respectively.

As illustrated in these drawings, the guide rail 10 is sealed by the space formed by mainly the guide rail cover 19, the front surface of the movable side casing 12 (side surface of the connecting portion with the fixed portion 2), the ceiling portion cover 21, and the side portion cover 22 when the elevating/lowering portion 3 is lowered and positioned downward. The guide rail 10 is sealed by the space formed by mainly the front surface of the movable side casing 12 (side surface of the connecting portion with the fixed portion 2), the fixed-side cover 20, the ceiling portion cover 21, and the side portion cover 22 when the elevating/lowering portion 3 is elevated and positioned upward.

Thereby, the substrate conveyance robot according to this embodiment can maintain the clean atmosphere of the preparation space since the surface of the guide rail 10 which may be a contamination source for the clean atmosphere is not exposed over the whole elevating/lowering stroke of the elevating/lowering portion 3.

Note that, in this embodiment, the movable side casing 12 is constructed by connecting plate members including the front surface, and therefore a fixed end portion 18 of the cable bare 17 is supported by a cable bare supporting portion 23 provided to the bottom portion of the fixed-side cover 20 connected to the fixed side casing 5 of the fixed portion 2, and cables connect a terminal portion of the cable bare fixed end portion 18 and a terminal board in the fixed side casing 5 through the lower portion of the fixed-side cover 20 and the open end of the bottom portion of the movable side casing 12 and the like, as illustrated in FIG. 4.

In the embodiment above, the base 63 of the substrate conveyance robot is arranged close to the wafer processing apparatus 106 side in the depth direction of the preparation space 116, while it may be arranged close to the FOUP 102 side.

DESCRIPTION OF REFERENCE NUMERALS

1 . . . elevating/lowering drive mechanism of substrate conveyance robot
2 . . . fixed portion
3 . . . elevating/lowering portion
4 . . . base portion link
5 . . . fixed side casing (fixed portion cover)
6 . . . ball screw
7 . . . nut member
8 . . . motor
9 . . . pulley mechanism
10 . . . guide rail
11 . . . fan
12 . . . movable side casing
13 . . . supporting member
14 . . . moving body
15 . . . opening
16 . . . cable arrangement area
17 . . . cable bare
18 . . . cable bare fixed end portion
19 . . . guide rail cover
20 . . . fixed-side cover
21 . . . ceiling portion cover
22 . . . side portion cover
23 . . . cable bare supporting portion
62A . . . robot arm
64 . . . robot hand (end effector)
65A . . . first link
66A . . . second link
101 . . . semiconductor manufacturing apparatus
102 . . . FOUP
105 . . . inside-FOUP space
106 . . . wafer processing apparatus
107 . . . wafer conveyance apparatus
111 . . . processing space
116 . . . preparation space
119 . . . aligner
W . . . wafer

The invention claimed is:

1. A substrate conveyance robot comprising:
a robot arm having a distal end portion to which an end effector for holding a substrate is provided;
an elevating/lowering drive mechanism for elevating/lowering the robot arm; and
a cover unit for covering the elevating/lowering drive mechanism,
wherein the elevating/lowering drive mechanism has a fixed portion to which a guide rail extending in a vertical direction is provided, and an elevating/lowering portion which is driven to be elevated/lowered along the guide rail,
wherein the robot arm has a base portion link which is connected to the elevating/lowering portion to be turned, and a link member which is connected to the base portion link to be turned and includes the distal end portion,
wherein the cover unit has a fixed-side cover which is provided to the fixed portion and in which the elevating/lowering portion moves, and a guide rail cover which is provided to the elevating/lowering portion, the guide rail cover provided for covering an upper portion of the guide rail which is exposed when the elevating/lowering portion is lowered, and
wherein, when the elevating/lowering portion moves in the vertical direction, the fixed-side cover does not move, and the guide rail cover moves.

2. The substrate conveyance robot according to claim 1, wherein a height of an upper surface of the base portion link is equal to or below a height of an upper surface of the fixed portion when the elevating/lowering portion is lowered to a lowest point.

3. The substrate conveyance robot according to claim 1, wherein an upper end the guide rail cover is equal to a height of an upper surface of the fixed portion when the elevating/lowering portion is lowered to a lowest point.

4. The substrate conveyance robot according to claim 1, wherein the link member has two or more links which are connected to each other to be turned.

5. The substrate conveyance robot according to claim 1, further comprising a ceiling portion cover having a distal end portion protruding to a position proximate to the guide rail cover above the guide rail.

6. A substrate conveyance apparatus comprising:
the substrate conveyance robot according to claim 1; and
a preparation space forming portion in which the substrate conveyance robot is located.

7. The substrate conveyance apparatus according to claim 6,
wherein the substrate conveyance robot has a base including the elevating/lowering drive mechanism, and
wherein the base is arranged closer to one side than to another side in a depth direction of an inside of the preparation space forming portion.

* * * * *